United States Patent
Turner (10) Patent No.: US 7,298,646 B1
(45) Date of Patent: Nov. 20, 2007

(54) APPARATUS FOR CONFIGURING PROGRAMMABLE LOGIC DEVICES AND ASSOCIATED METHODS

(75) Inventor: John Turner, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 29 days.

(21) Appl. No.: 10/916,334

(22) Filed: Aug. 11, 2004

(51) Int. Cl.
*G11C 11/34* (2006.01)
*H03K 19/173* (2006.01)

(52) U.S. Cl. .......................... 365/185.01; 365/185.13; 365/185.26; 365/185.33; 326/38; 326/41

(58) Field of Classification Search ................. 326/38, 326/39, 41; 365/185.01, 185.13, 185.26, 365/185.33
See application file for complete search history.

(56) References Cited

U.S. PATENT DOCUMENTS

| | | | |
|---|---|---|---|
| 5,243,575 A | | 9/1993 | Sambandan et al. |
| 5,602,779 A | * | 2/1997 | Gotou ................. 365/185.23 |
| 5,737,258 A | | 4/1998 | Choi et al. |
| 5,812,458 A | * | 9/1998 | Gotou ................. 365/185.23 |
| 5,818,848 A | | 10/1998 | Lin et al. |
| 5,867,430 A | | 2/1999 | Chen et al. |
| 6,141,250 A | | 10/2000 | Kashimura |
| 6,157,577 A | | 12/2000 | McPartland |
| 6,201,736 B1 | | 3/2001 | Komatsu |
| 6,215,689 B1 | * | 4/2001 | Chhor et al. ................. 365/63 |
| 6,262,914 B1 | * | 7/2001 | Smayling et al. ....... 365/185.11 |
| 6,317,349 B1 | | 11/2001 | Wong |
| 6,345,000 B1 | | 2/2002 | Wong et al. |
| 6,363,019 B1 | * | 3/2002 | Erickson et al. ........ 365/189.07 |
| 6,614,684 B1 | * | 9/2003 | Shukuri et al. ......... 365/185.05 |
| 6,654,284 B2 | | 11/2003 | Hsu et al. |
| 6,703,275 B2 | | 3/2004 | Ahn et al. |
| 6,714,453 B2 | | 3/2004 | Cavaleri et al. |
| 2003/0122578 A1 | * | 7/2003 | Masui et al. .................. 326/39 |

OTHER PUBLICATIONS

Pavan et al., "Flash Memory Cells-An Overview", Proceedings Of The IEEE, vol. 85, No. 8, Aug. 1997, pp. 1248-1271.
Samsung Flash Team, Flash Technology, Samsung Electronics Co., LTD, Apr. 2003, 115 pgs.
Kang, "CMOS Digital Integrated Circuits", Chapter 8, Semiconductor Memories, Oct. 2002, 27 pgs.
Rabaey et al., "Digital Integrated Circuits A Design Perspective", Semiconductor Memories, Dec. 2002, 107 pgs.
Digital Integrated Circuits, Lecture 28, Memory Perspectives, EE141, 2003, 18 pgs.

* cited by examiner

*Primary Examiner*—Vibol Tan
(74) *Attorney, Agent, or Firm*—Law Offices of Maximilian R. Peterson (57) ABSTRACT

A programmable logic device (PLD) includes a non-volatile configuration memory. The non-volatile configuration memory is adapted to configure programmable resources (such as programmable logic and programmable interconnect) within the PLD. The non-volatile configuration memory may constitute a variety of memory types, for example, flash memory, erasable programmable read-only memory (EPROM), electrically erasable read-only memory (EEPROM), anti-fuse, and the like.

6 Claims, 4 Drawing Sheets

APPARATUS FOR CONFIGURING PROGRAMMABLE LOGIC DEVICES AND ASSOCIATED METHODS

TECHNICAL FIELD

The inventive concepts relate generally to programmable or configurable circuitry and, more particularly, to apparatus and methods for configuring programmable logic devices (PLDs).

BACKGROUND

PLDs allow circuit designers to prototype relatively complex designs before finalizing the design. Compared to application specific integrated circuits (ASICs), PLDs provide designers the flexibility of revising or refining their designs in their laboratories without having a full-blown fabrication of each iteration or revision to the design.

In the field, end-users can program PLDs to readily implement a desired circuit. Should the user have a desire to modify the functionality of the circuit, the user can simply change the functionality and, hence, the circuitry, that the PLD implements. Although several approaches exist for configuring or programming PLDs, they suffer from various disadvantages, for example, shortcomings that can lead to errors in, or even malfunction or failure of, the user's circuit in the field.

SUMMARY

One aspect of the invention relates to apparatus for configuring PLDs. In one embodiment, a PLD includes a non-volatile configuration memory. The non-volatile configuration memory is adapted to configure programmable resources within the PLD.

In another embodiment, a memory circuit includes two floating-gate transistors coupled to each other, and a transistor. The transistor has a gate terminal and two current-carrying terminals. The gate terminal couples to a decode line. One of the current-carrying terminals couples to a bit line, and the other current-carrying terminal couples to the floating-gate transistors.

In a third embodiment, a PLD includes a configuration memory array, an interface circuit, programmable logic, and programmable interconnect. The configuration memory array includes non-volatile memory circuitry. The interface circuit couples to the configuration memory array, the programmable logic, and the programmable interconnect.

In a fourth embodiment, a memory array for configuring a PLD includes a plurality of configuration elements, and a plurality of transistors. Each configuration element includes two memory elements that couple to an output node of the configuration element. Each of the transistors couples to a respective one of the configuration elements. Furthermore, each transistor has a control terminal and two current-carrying terminals. The control terminal couples to a decode line. One current-carrying terminal couples to a bit line, and the other current-carrying terminal couples to the output node of a respective configuration element.

Another aspect of the invention relates to methods of configuring PLDs. In one embodiment, a method of operating a non-volatile configuration memory in a PLD includes writing configuration data for the PLD to the non-volatile configuration memory, and configuring programmable resources within the PLD by using the configuration data.

BRIEF DESCRIPTION OF THE DRAWINGS

The appended drawings illustrate only exemplary embodiments of the invention and therefore should not be considered as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

The inventive concepts contemplate apparatus and associated methods for configuring or programming PLDs. Apparatus and methods according to the invention provide a way of configuring PLDs in a flexible, reliable manner by using a memory array. If desired, one may use a non-volatile type of memory (as one example, a flash memory) to program or configure PLDs according to the invention.

The disclosed PLD configuration apparatus and associated methods have several advantages over conventional approaches. First, one may provide non-volatile configuration of PLDs. In conventional approaches, the PLD's configuration memory typically uses static random access memory (SRAM) circuitry. The configuration memory loses some or all of its contents upon removal of power or even a power disturbance. As a consequence, the PLD may lose some or all of its configuration.

In contrast, disclosed configuration memories use non-volatile memory circuitry that do not lose their contents in the event of a power disruption, failure, or disturbance. As a result, PLDs using those configuration memories retain their configurations, thus providing increased convenience, reliability, and utility to the PLD's user.

Second, the non-volatile nature of the configuration memories allows the user to avoid repeated configuration or programming the PLD. The user may configure or program the memory once and then use it repeatedly in the field. As another benefit, the non-volatile configuration memories provide an "instant-ON" capability. In other words, upon power-up or reset, the configuration memories can provide configuration data within a relatively short amount of time.

The non-volatile memories of course still provide the user with the option of re-configuring the PLD in the field, as desired, similar to conventional PLDs. The user may simply apply any desired source of configuration data (e.g., external memory, host, data or programming cable, etc.) to the PLD and re-configure or re-program the configuration memory and, hence, the PLD's functionality.

Third, configuration memories according to the invention are less prone to radiation errors. Conventional configuration memories often use memory circuits that occupy relatively large areas within a PLD. The relatively large area tends to make the memory susceptible to errors as a result of radiation.

The radiation may originate from a variety of sources, such as cosmic rays, background radiation, radioactive sources, etc. Regardless of the source, the radiation can cause soft errors, and sometimes hard errors, in the memory and, hence, in the PLD itself. In contrast, the disclosed configuration memories have less susceptibility to such errors.

Figure 1:
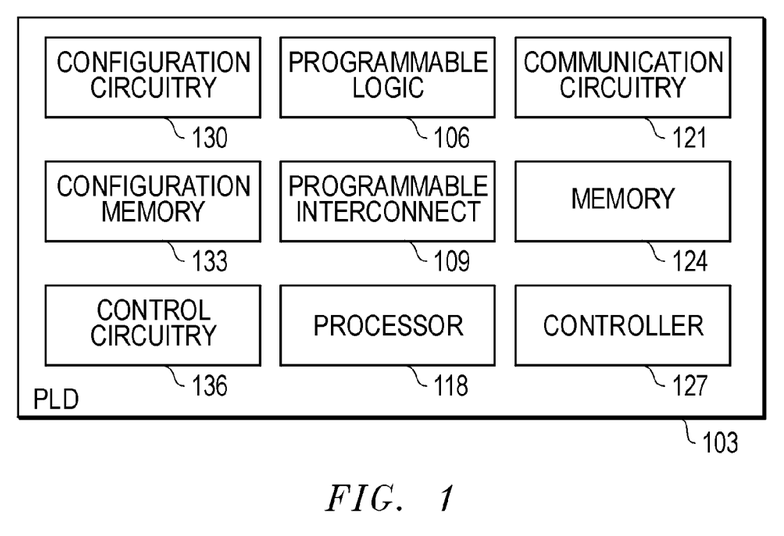
FIG. 1 shows a general block diagram of a PLD according to an illustrative embodiment of the invention that includes the disclosed configuration memory

FIG. 1 shows a general block diagram of a PLD 103 according to an illustrative embodiment of the invention that includes the disclosed configuration memory. PLD 103 includes configuration circuitry 130, configuration memory 133 (also known as configuration random-access memory, or CRAM), control circuitry 136, programmable logic 106, and programmable interconnect 109.

In addition, PLD 103 may include one or more processors 118, one or more communication circuitry 121, one or more memories 124, one or more controllers 127, as desired. The user may implement a design using the various resources of the PLD, such as programmable logic 106, programmable interconnect 109, etc.

Note that FIG. 1 shows a simplified block diagram of PLD 103. Thus, PLD 103 may include other blocks and circuitry, as persons of ordinary skill in the art understand. Examples of such circuitry include clock generation and distribution circuits, redundancy circuits, test/debug circuits, and the like. Furthermore, PLD 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers, logic gates, registers, memory, and the like. The programmable logic circuitry may implement arbitrary logic functions, arithmetic functions, or both, as desired. Persons of ordinary skill in the art may recognize the blocks of configurable or programmable logic by various names, such as logic elements (LEs).

Programmable interconnect 109 couples to programmable logic 106. Programmable interconnect 109 provides configurable interconnects (coupling mechanisms) between various blocks within programmable logic 106 and other circuitry within or outside PLD 103. Programmable interconnect 109 may use pass-logic (i.e., logic circuitry including pass transistors) and multiplexers (MUXs) to route signals in the PLD fabric, as desired.

Configuration memory 133 stores configuration data for PLD 103. Configuration memory 133 may obtain the configuration data from an external source, such as a storage device, a host, etc. Control circuitry 136 controls various operations within PLD 103. Under the supervision of control circuitry 136, PLD configuration circuitry 130 uses configuration data from configuration memory 133 to program or configure the functionality of PLD 103.

The configuration data determine the functionality of PLD 103 by programming the configurable resources of PLD 103, such as programmable logic 106 and programmable interconnect 109. More specifically, data bits within configuration memory 133 cause the programmable resources to implement a desired function and, ultimately, the user's circuit or system.

For example, configuration memory data bits may determine what type of logic, arithmetic function, or both, various circuitry within programmable logic 106 implement. As another example, configuration memory data bits may provide desired or programmed signal routing paths within programmable interconnect 109 by driving gates or pass transistors or select inputs of MUXs, etc.

As noted above, PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuitry 121. Communication circuitry 121 may facilitate data and information exchange between various circuits within PLD 103 and circuits external to PLD 103, as persons of ordinary skill in the art who have the benefit of the description of the invention understand.

As an example, communication circuitry 121 may provide various protocol functionality (e.g., Transmission Control Protocol/Internet Protocol (TCP/IP) (including the physical layer, or PHY), User Datagram Protocol (UDP) etc.), as desired. As another example, communication circuitry 121 may include network (e.g., Ethernet, token ring, etc.) or bus interface circuitry, as desired.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

Figure 2:
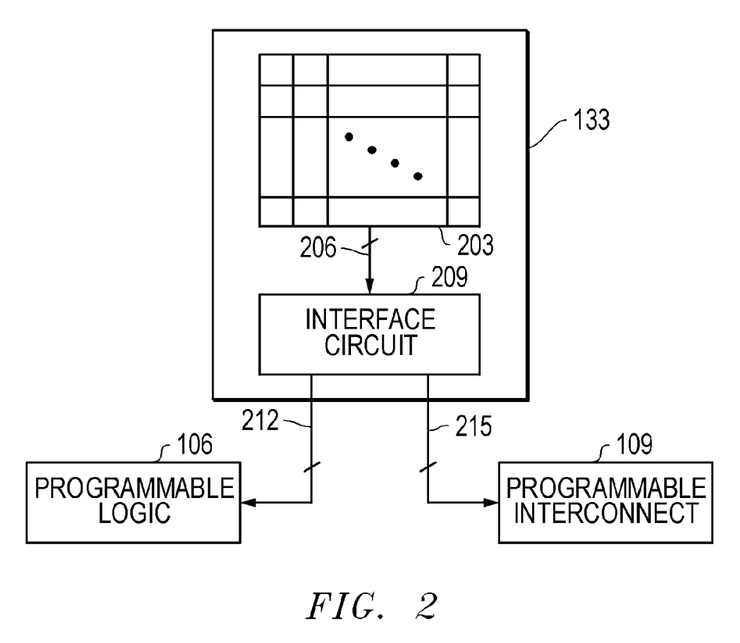
FIG. 2 illustrates a functional block diagram of a circuit arrangement for configuring programmable logic and programmable interconnect in a PLD according to an exemplary embodiment of the invention.

FIG. 2 shows a functional block diagram of a circuit arrangement for configuring programmable logic and programmable interconnect in a PLD according to an exemplary embodiment of the invention. FIG. 2 includes configuration memory 133, programmable logic 106 and programmable interconnect 109. Configuration memory 133 includes memory array 203 and interface circuit 209.

Memory array 203 stores configuration data for the PLD. In exemplary embodiments, memory array 203 may have a two-dimensional array arrangement, i.e., an array of memory cells arranged in one or more rows and one or more columns. Note that the array arrangement refers to a conceptual or logical arrangement of the memory cells. The physical arrangement of the memory cells within the PLD depends on various factors, such as the technology and cell and array layout used, and does not necessarily have a two-dimensional arrangement.

Memory array 203 provides configuration data to interface circuit 209 via signal link 206. Signal link 206 includes a coupling mechanism to communicate the data signals to interface circuit 209. Note that signal link 206 may include signal communication mechanisms for other signals, for example, for control and status signals, as desired, and as persons of ordinary skill in the art with the benefit of the description of the invention understand.

Furthermore, the coupling mechanism may provide for uni-directional or bi-directional communication of signals between memory array 203 and interface circuit 209, as desired. Typically, data signals flow from memory array 203 to interface circuit 209. In embodiments where one desires to alter the contents of memory array 203 via interface circuit 209, however, signals may flow between memory array 203 and interface circuit 209 in a bi-directional manner. More specifically, signal link 206 may include control and status signals, bi-directional data signals, and address signals, as desired.

Interface circuit 209 provides configuration data signals to programmable logic 106 and programmable interconnect 109. The configuration data program or configure the functionality of various resources within programmable logic 106, as described above.

More specifically, interface circuit 209 communicates configuration data to programmable logic 106 via signal link 212. Signal link 212 may have extra signal communication mechanisms for other signals, for example, for control and status signals, as desired, and as persons of ordinary skill in the art with the benefit of the description of the invention understand.

The coupling mechanism may provide for unidirectional or bi-directional communication of signals between interface circuit 209 and programmable logic 106, as desired. In typical arrangements, signals flow from interface circuit 209 to programmable logic 106. In some embodiments, however, signals (e.g., status signals) may flow from programmable logic 106 to interface circuit 209.

Interface circuit 209 also communicates interconnect configuration data to programmable interconnect 109 via signal link 215. Signal link 215 may have additional signal communication mechanisms for other signals, such as control and status signals, as desired, and as persons of ordinary skill in the art with the benefit of the description of the invention understand.

The coupling mechanism may provide for unidirectional or bi-directional communication of signals between interface circuit 209 and programmable interconnect 109, as desired. In typical arrangements, signals flow from interface circuit 209 to programmable interconnect 109. In some embodiments, however, signals (for example, status signals) may flow from programmable interconnect 109 to interface circuit 209.

Generally, interface circuit 209 operates under the supervision of control circuit 136 (see FIG. 1). As noted above, control circuit 136 controls the overall operation of the PLD, including its power-up sequence. Interface circuit 209 may receive control signals (not shown) from control circuit 136. The control signals may direct the operation of interface circuit 209, such as the details of providing configuration data to programmable logic 106 and programmable interconnect 109. Furthermore, interface circuit 209 may provide signals, such as status or information signals, to control circuit 136.

Persons of ordinary skill in the art who have the benefit of the description of the invention appreciate that the diagram in FIG. 2 shows a conceptual arrangement (rather than necessarily the physical arrangement) and related signal and data flow for configuring PLD resources. The topology and details of an actual implementation depend on various factors, such as the architecture of the PLD, design and performance specifications for that implementation, etc.

In a typical implementation, one integrates memory array 203 and interface circuit 209 with or within programmable logic 106 and programmable interconnect 109 (in other words, memory array 203 and interface circuit 209 have a distributed nature, rather than constitute physically identifiable blocks of circuitry). Furthermore, the actual circuitry for interface circuit 209 varies depending on the details of the particular implementation and may be as simple as a set of coupling mechanisms, such as wires or integrated circuit traces.

Figure 3:
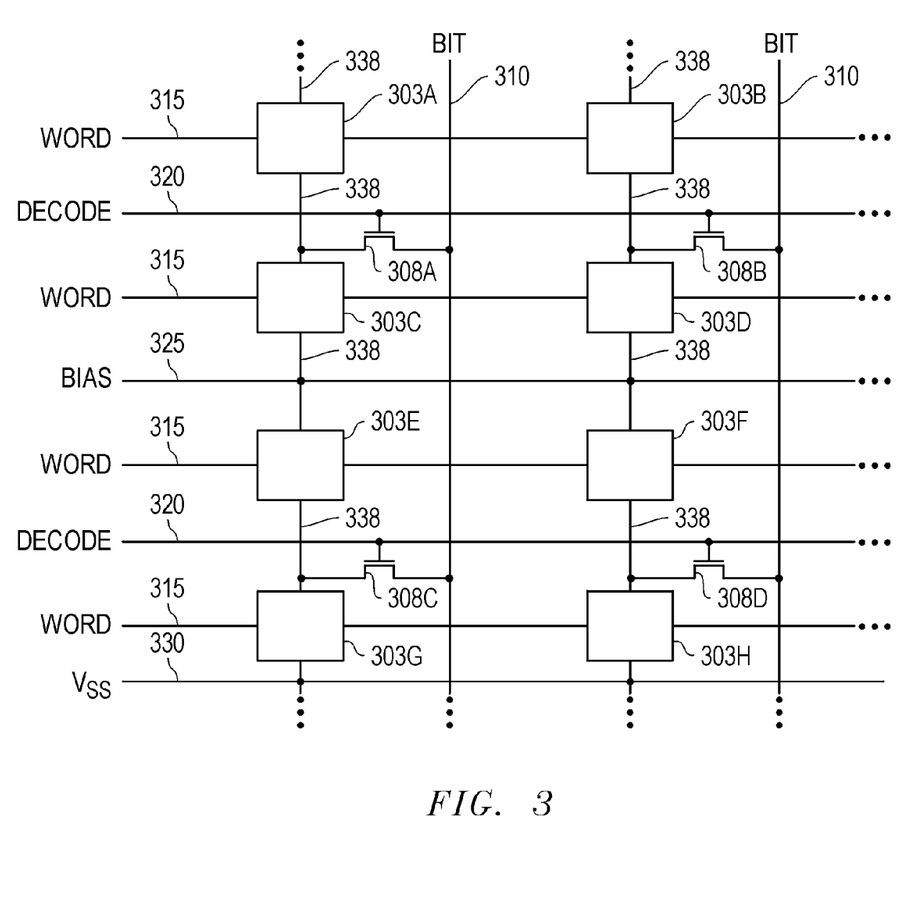
FIG. 3 depicts more details of a portion of a memory array according to an exemplary embodiment of the invention.

FIG. 3 shows more details of a portion of memory array 203 according to an exemplary embodiment of the invention. The portion of memory array 203 shown includes memory elements 303A-303H, and transistors 308A-308D. Memory elements 303A-303H have a two-dimensional array arrangement. Typically, a memory element in the array couples to neighboring memory elements.

Memory elements (e.g., 303A-303H) couple to various signal lines in memory array 203. The signal lines include bit lines 310, word lines 315, bias lines 325, decode lines 320, and ground (labeled as "$V_{SS}$") lines 330. With respect to the two-dimensional portion of memory array 203 shown in FIG. 3, word lines 315 run the horizontal span of the memory array 203. On the other hand, bit lines 310 run the vertical span of the memory array 203.

Some of memory elements 303A-303H couple to one of bit lines 310 via one of transistors 308A-308D. Transistors 308A-308D essentially perform the function of a switch. The embodiment depicted in FIG. 3 shows transistors 308A-308D as metal oxide semiconductor field-effect transistors (MOSFETs). As persons of ordinary skill in the art who have the benefit of the description of the invention understand, however, one may other transistors or circuit arrangements instead.

Memory elements 303A-303H couple in an array formed by column lines 310, coupling segments 338, and bias lines 325. During programming, bias lines 325 have the same or nearly the same potential as ground lines 330 ($V_{SS}$). During normal operation, however, bias lines 325 become the positive rail supply to a respective pair of memory elements 303A-303H, and have the same or nearly the same potential as the supply voltage ($V_{DD}$).

Transistors 308 facilitate the programming and verification of memory array 203. More specifically, each of transistors 308 allows the selection of a corresponding one of memory elements 303A-303H. Once one has performed the programming of memory array 203, all transistors 308 are in the OFF state, bias lines 325 raise to the supply voltage potential (or approximately the supply voltage potential). The contents of each pair of memory cells or elements 303A-308H becomes available at the respective output nodes (see FIG. 4 and its corresponding description) as a full-rail output signal.

One may use the output signals to drive various circuitry within the PLD to perform desired logic functions. This arrangement provides some desirable functionality, made possible by decode transistors 308 and separate bias lines 325. First, it provides the simplicity of a row- and column-based (or X-and-Y-based) array programming. Second, it also provides the capability to read individual output signals as full-rail signals upon the completion of the programming.

The circuit arrangement shown in FIG. 3 operates as follows. By selectively applying a signal to the gate of one of transistors 308A-308D, one may turn that transistor ON. As a result, a corresponding one of memory elements 303A-303H couples to one of bit lines 310. Decode lines 320 drive the gates of transistors 308A-308D. By selective assertion of one of decode lines 320, one may turn ON respective ones of transistors 308A-308D and therefore couple associated memory elements to bit lines 310.

Bias lines 325 allow the application of a selected or desired bias level (such as a voltage level) to respective memory elements 303A-303H. The magnitude or level of the signal present on bias lines 325 depends on the particular arrangement and type of circuitry in memory elements 303A-303H, as described below in detail. Ground lines 330 couple to the circuit ground potential (denoted as "$V_{SS}$" for the embodiments using field-effect transistors (FETs), as the figures illustrate).

Each pair of memory elements 303A-303H provide one bit of configuration memory for the PLD. The embodiment shown pairs the memory elements in the vertical direction. For example, memory element 303E and memory element 303G implement one bit of storage. As another example, memory element 303F and memory element 303H form an additional bit of storage for configuration data.

Note that one may write the contents of memory array 203 in a serial or random-access manner. In other words, during the configuration phase, one obtains the configuration data from a desired source. One then writes or programs the memory elements serially or in a random-access fashion in order to write PLD configuration data into them.

Subsequently, during normal operation of the PLD, one can read the contents of memory array 203 in a parallel manner. In that mode, the outputs of memory array 203 (through bit lines 310) affect the functions that the programmable resources of the PLD perform. In other words, the contents of memory array 203 drive the programmable resources of the PLD, such as programmable logic 106 and programmable interconnect 109, in order to implement the user's design or system.

Figure 4:
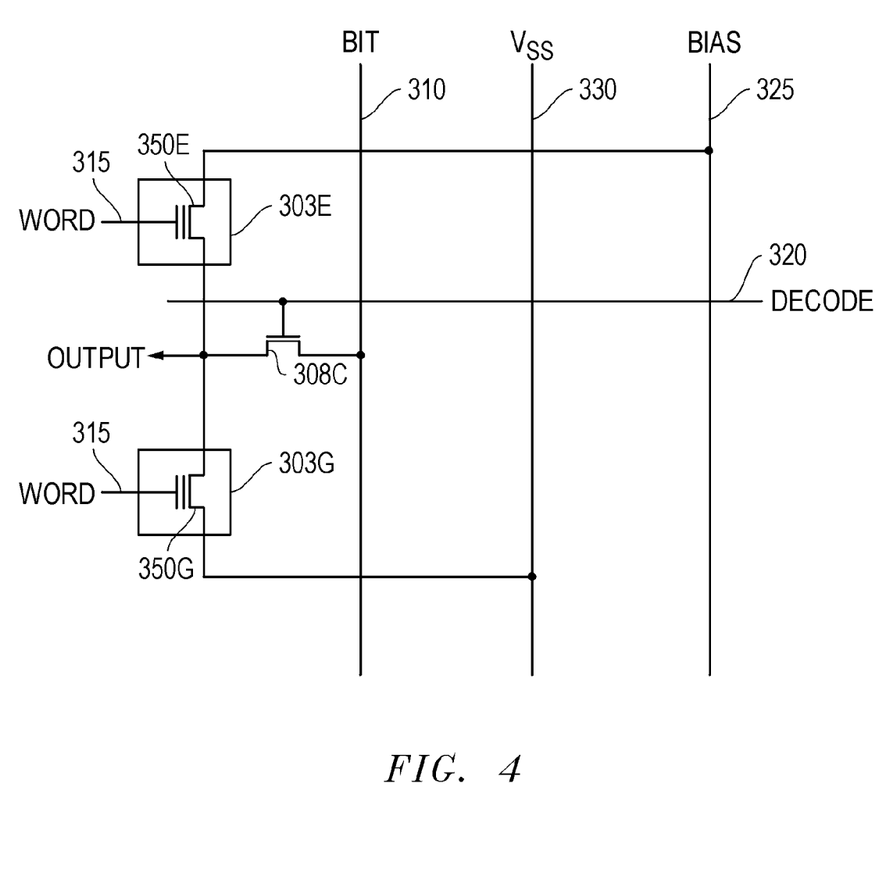
FIG. 4 shows a circuit arrangement that includes memory elements according to an exemplary embodiment of the invention that uses non-volatile memory.

FIG. 4 depicts a circuit arrangement that includes memory elements according to an illustrative embodiment of the invention that uses non-volatile memory. More specifically, FIG. 4 shows an exemplary pair that includes memory element 303E and memory element 303G, and associated transistor 308C. Memory element 303E includes floating-gate transistor 350E, whereas memory element 303G includes floating-gate transistor 350G. Note that other memory elements (see FIG. 3) in memory array 203 (see FIG. 2) have a similar circuit arrangement and operate in a like manner.

Floating-gate transistors 350E and 350G provide non-volatile storage of configuration data. Persons skilled in the art with the benefit of the description of the invention understand the details of how the floating-gate transistors operate in the embodiment shown.

Briefly, by application of appropriate signals (such as a signal of a suitable voltage level), one may deposit a desired type and quantity of charge on the floating gate of one or more of the floating-gate transistors. The charge constitutes stored information, and causes changes in the behavior of the transistor in a manner that allows one to read the stored information and determine what it information it represents.

The control gate of each transistor couples to a respective one of word lines 315. In other words, the control gate of transistor 350E couples to the upper word line 315 in the figure. Likewise, the control gate of transistor 350G couples to the lower word line 315 in the figure.

One current-carrying terminal (e.g., drain) of transistor 350E couples to bias line 325. Another current-carrying terminal (e.g., source) of transistor 350E couples to the output of the circuit. One current-carrying terminal (e.g., drain) of transistor 350G couples to the output of the circuit. Another current-carrying terminal (e.g., source) of transistor 350G couples to ground line 330.

Transistor 308C selectively couples the output of the circuit to bit line 310. More specifically, one current-carrying terminal (e.g., drain) of transistor 308C couples to the output of the circuit, whereas another current-carrying terminal (e.g., source) of transistor 308C couples to bit line 310. Decode line 320 couples to the gate terminal of transistor 308C. By applying a signal to decode line 320, one may turn ON transistor 308C and, hence, couple the output of the circuit to bit line 310.

Referring to FIGS. 3 and 4, transistor 308A allows writing or placing the programming data on bit line 310 into the desired pair of memory elements (in this example, memory elements 303E and 303G). More specifically, transistor 308A isolates memory elements 303A and 303C (and all other memory elements not shown explicitly in FIG. 3) from bit line 310. Programming of the memory elements proceeds sequentially until programming is complete.

Two memory elements with a common output (e.g., memory elements 303E and 303G) form a configuration element. One programs configuration elements with complementary data so as to supply a full-rail logic level at the output of each pair of memory elements.

Transistors 308A-308D also allow sequential verification of respective configuration or memory elements by coupling desired memory elements to a corresponding one of bit line 310. To verify the signal level present on a particular bit line 310, one may use a sense amplifier (not shown explicitly) coupled to that bit line. Once programming and verification have completed, transistors 308A-308D remain in the OFF state, and pairs of memory elements with common outputs operate together to form a single configuration element (for example, memory elements 303E and 303G together form a configuration element).

Although the exemplary embodiments show flash-type circuitry for implementing the memory elements (and memory array 203, generally), one may use a variety of other circuitry by making modifications to the disclosed embodiments, as desired. The modifications fall within the level of skill and knowledge of persons of ordinary skill in the art who have the benefit of the description of the invention. Some examples of alternative circuitry and memory types include erasable programmable read-only memory (EPROM), electrically erasable read-only memory (EEPROM), anti-fuse, MNOS, EAROM, nanomems, carbon nanotube structures, and the like.

Configuration memories according to the disclosed concepts have several modes, including a write mode, a verification mode, and a operational or read mode. The write mode of operation allows one to store PLD configuration data in memory array 203. The verify mode of operation allows the verification of the data stored during the write mode. Finally, the operational or read mode allows retrieving the stored data and using the data to configure the functionality of the PLD's programmable resources, as described above.

For embodiments using flash cells (see, for example, FIG. 4), one performs an erase operation before commencing a write operation. In the write mode of operation, decode lines 320 have a logic-high level. The logic-high level turns ON transistors 308A-308D (see FIG. 3), thus coupling the respective memory element outputs and bit lines 310. As a result, one may access the corresponding memory elements 303A-303H for the write operation.

Furthermore, word lines 315 corresponding to the memory elements to be written also have a logic-high level. Put another way, by asserting an appropriate logic level (logic high for the embodiments shown), word lines 315 allow the selection of memory elements into which one wishes to write configuration data. To write a particular row of memory array 203, the appropriate word line. Thus, by activating an appropriate combination of decode lines 320 and word lines 315, one may access desired ones of memory elements 303A-303H for the write operation.

As noted above, ground lines 330 have a ground potential. During the write mode, bias lines 325 also have a voltage level near or at ground potential. Bi-directional bit lines 310 allow accessing desired portions of memory array 203 for read and write operations. In the write mode of operation, one uses appropriate bit lines 310 to write data into desired-ones of memory elements 303A-303H.

Similar to the write mode, during the verification mode, decode lines 320 have a logic-high level. The logic-high level turns ON transistors 308A-308D (see FIG. 3), which couples the respective memory element outputs and bit lines 310. As a result, one may access the corresponding memory elements 303A-303H for the verify operation.

During the verification mode, ground lines 330 have a ground potential. Bias lines 325 have a voltage level near or at ground potential. Bi-directional bit lines 310 allow accessing desired portions of memory array 203 for verification of their contents. Thus, by examining appropriate bit lines 310, one may verify that desired ones of memory elements 303A-303H have appropriate data stored in them.

During the operational or read mode, decode lines 320 have a logic-low level. The logic-low level turns OFF transistors 308A-308D (see FIG. 3), thus decoupling the respective memory element outputs from bit lines 310.

Furthermore, for each of the memory elements in memory array 203, word lines 315 have a voltage level that causes transistors 350E and 350G (see FIG. 4) to be in opposite states (e.g., only one transistor in the ON state). Put another way, the voltage level of word lines 315 allows a programmed transistor (e.g., one of transistors 350E and 350G in FIG. 4) to be in one state (e.g., the OFF state), and an erased transistor to be in the opposite state (e.g., in the ON state).

As noted above, ground lines 330 have a ground potential. During the write mode, bias lines 325 have a voltage level near or at the supply voltage, or $V_{DD}$. Bi-directional bit lines 310 allow reading the contents of memory array 203 and using those contents to cause the programmable resources of the PLD to implement the desired functionality. Furthermore, as noted above, the detailed description of the various circuit functions provided above relate to memory elements 303E and 303G. Persons of ordinary skill in the art who have the benefit of the description of the invention appreciate that other parts of the circuitry have a similar circuit arrangement and operate in a like manner.

Figure 5:
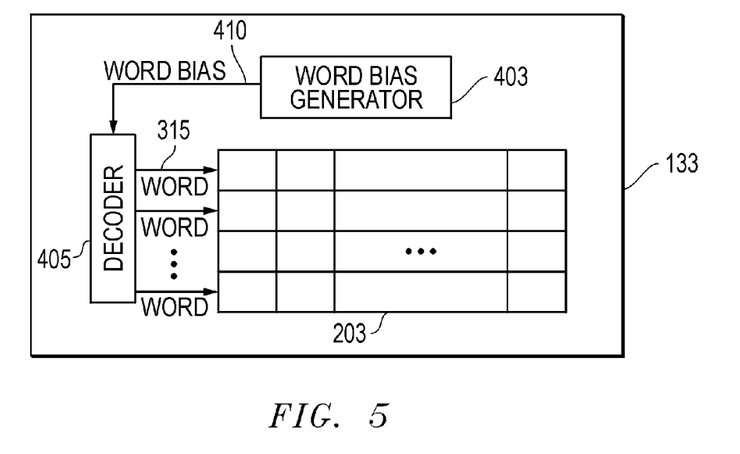
FIG. 5 illustrates a circuit arrangement for providing bias voltages for word lines in exemplary embodiments according to the invention.

FIG. 5 shows a circuit arrangement for providing bias voltages for word lines 315 in exemplary embodiments according to the invention. The circuit arrangement includes memory array 203, decoder 405, and word bias generator 403.

Depending on the mode of operation of memory array 203 (as described above), word bias generator 403 generates an appropriate word bias signal 410. In other words, depending on whether memory array 203 operates in the write, verify, or read modes (as indicated, for example, by a signal, not shown explicitly), word bias generator 403 generates a voltage level appropriate for that mode of operation and provides word bias signal 410 to decoder 405.

Decoder 405 provides word lines 315, with appropriate voltage levels, to memory array 203. More specifically, depending on which portions or memory elements within memory array 203 one wishes to access (for write, verify, or read operations), decoder 405 asserts proper voltage levels on word lines 315 for that operation, as described above.

Figure 6:
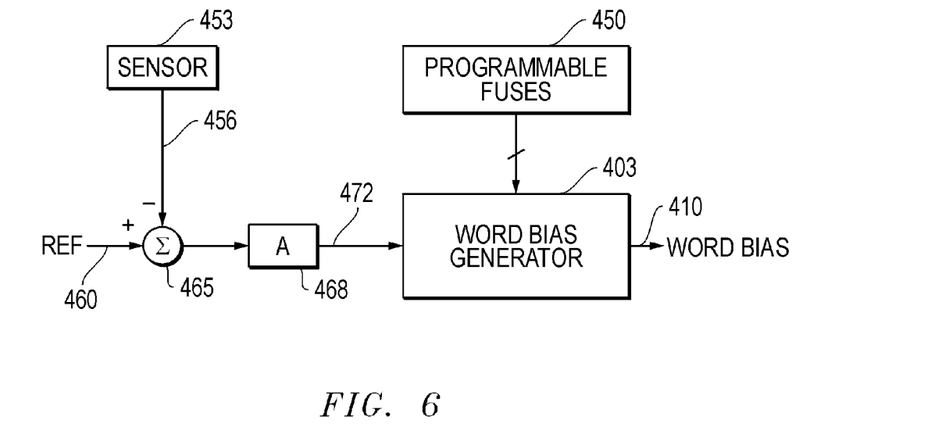
FIG. 6 depicts a circuit arrangement for generating word bias signals in exemplary embodiments according to the invention.

FIG. 6 shows a circuit arrangement for generating word bias signals in exemplary embodiments according to the invention. The circuit arrangement includes word bias generator 403, programmable fuses 450, sensor 453, summing circuit 456, and amplifier 468.

The circuit arrangement in FIG. 6 allows one to take into account characteristics of a particular PLD, operating conditions, or both, in order to generate appropriate word bias signal 410. For example, one may generate word bias-signal 410 such that its level depends on one or more desired semiconductor process parameters for a particular PLD, or device characteristics for a particular PLD, wafer, or batch of PLDs.

As another example, one may generate word bias signal 410 such that it takes into account the PLD's operating and/or environmental conditions, such as temperature (e.g., temperature of a particular circuit, or the entire die), voltage levels, such as supply voltages, and the like, as desired. By providing word bias signal 410 based on the operating or environmental conditions, one may adjust the voltage level of word bias signal 410 in a dynamic or time-varying manner.

More specifically, one store within the PLD particular characteristics of a particular device, die, or circuit. In other words, during or after manufacture of the particular device (e.g., PLD, batch of PLDs, or a wafer), one may measure particular characteristics, for example, threshold voltage of one or more transistors. One may then store some or all of those characteristics within the PLD.

To do so, one may encode and store the desired information by using programmable fuses 450. As persons of ordinary skill in the art who have the benefit of the description of the invention understand, depending on factors such as design and performance specifications and available or desired technology, one may use other techniques for storing the information.

During operation, word bias generator 403 uses the encoded/stored information to generate appropriate levels of word bias signal 410. In other words, word bias generator 403 decodes or extracts the encoded/stored information in order to obtain information about the particular characteristics of the PLD in which it resigns. Using that information, word bias generator 403 generates appropriate bias levels for word lines 315.

As noted above, in addition, or instead of taking into account the PLD's characteristics to generate word bias signal 410, one may also use one or more of the PLD's operating and/or environmental conditions. To do so, sensor 453 senses the operating and/or environmental condition(s) and generates signal 456.

Summing circuit 465 receives signal 456, compares it to reference signal 460, and provides the resulting signal (an error signal) to amplifier 468. The output signal of summing circuit 465 constitutes a difference signal, i.e., the difference between reference signal 460 and output signal 456 of sensor 453.

Amplifier 468 amplifies the output signal of summing circuit 465 and generates signal 472. Word bias generator 403 generates word bias signal 410 based at least in part on signal 472.

Persons of ordinary skill in the art who have the benefit of the description of the invention recognize that amplifier 468 may constitute an optional circuit block, based on factors such as the gain of summing circuit 465, the characteristics of the particular circuitry within word bias generator 403, or both. Furthermore, one may omit summing circuit 468 (and reference signal 460) and use signal 456 as the input signal of amplifier 468 (or word bias generator 403), as desired. In such a situation, word bias signal 410 depends on the sensed signal 456, rather than on the difference between sensed signal 456 and reference signal 460.

Generally, note that one may apply the inventive concepts effectively to various programmable logic circuitry or ICs known by other names in the art, as desired, and as persons skilled in the art with the benefit of the description of the invention understand. Such circuitry includes devices known as field-programmable gate array (FPGA), complex programmable logic device (CPLD), and programmable gate array (PGA).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown.

For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

I claim:

1. A programmable logic device (PLD), comprising:
   a configuration memory array, the configuration memory array comprising non-volatile memory circuitry coupled to a bias line, a decode line, and a plurality of word lines;
   an interface circuit coupled to the configuration memory array;
   a decoder coupled to the plurality of word lines of the memory array;
   a word bias generator circuit coupled to the decoder, the word bias generator configured to provide a word bias signal derived from at least one semiconductor process parameter of the programmable logic device (PLD) encoded in a plurality of fuses coupled to the word bias generator circuit;
   programmable logic coupled to the interface circuit; and
   programmable interconnect coupled to the interface circuit.

2. The programmable logic device (PLD) according to claim 1, wherein the at least one semiconductor process parameter of the programmable logic device (PLD) comprises a threshold voltage of a transistor within the programmable logic device (PLD).

3. The programmable logic device (PLD) according to claim 1, wherein the memory array comprises flash memory.

4. The programmable logic device (PLD) according to claim 1, wherein the memory array comprises anti-fuse circuitry.

5. The programmable logic device (PLD) according to claim 1, wherein the memory array comprises erasable programmable read-only memory (EPROM).

6. The programmable logic device (PLD) according to claim 1, wherein the memory array comprises electrically erasable read-only memory (EEPROM).

* * * * *